United States Patent
Fung et al.

(10) Patent No.: US 9,997,600 B2
(45) Date of Patent: Jun. 12, 2018

(54) SEMICONDUCTOR DEVICE INCLUDING FIN STRUCTURES DISPOSED OVER BUFFER STRUCTURES

(71) Applicant: TAIWAN SEMICONDUCTOR MANUFACTURING CO., LTD., Hsinchu (TW)

(72) Inventors: Ka-Hing Fung, Hsinchu County (TW); Yen-Ming Chen, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/407,856

(22) Filed: Jan. 17, 2017

(65) Prior Publication Data

US 2017/0125525 A1 May 4, 2017

Related U.S. Application Data

(62) Division of application No. 14/815,722, filed on Jul. 31, 2005, now Pat. No. 9,583,623.

(51) Int. Cl.
*H01L 27/088* (2006.01)
*H01L 29/10* (2006.01)
(Continued)

(52) U.S. Cl.
CPC ........ *H01L 29/1054* (2013.01); *H01L 29/161* (2013.01); *H01L 29/20* (2013.01); *H01L 29/785* (2013.01)

(58) Field of Classification Search
CPC ............. H01L 27/0886; H01L 27/0924; H01L 27/10826; H01L 27/10879; H01L 27/1211;
(Continued)

(56) References Cited

U.S. PATENT DOCUMENTS 7,667,271 B2   2/2010   Yu et al.
8,362,575 B2   1/2013   Kwok et al.
(Continued)

FOREIGN PATENT DOCUMENTS

KR   10-1452122 B1   10/2014
KR   10-1504311 B1    3/2015
WO   2014/209390 A1  12/2014

OTHER PUBLICATIONS

Non-Final Office Action U.S. Appl. No. 14/815,722 dated Jul. 12, 2016.
(Continued)

*Primary Examiner* — Hoai V Pham
(74) *Attorney, Agent, or Firm* — McDermott Will & Emery LLP

(57) ABSTRACT

A semiconductor FET device includes a buffer structure and a fin structure. The buffer structure has a fin shape, is disposed over a substrate and extends along a first direction. The fin structure includes a channel region of the FET device, is disposed on the buffer structure and extends along the first direction. The width of the buffer structure along a second direction perpendicular to the first direction is greater than the width of the fin structure along the second direction measured at an interface between the buffer structure and the fin structure.

22 Claims, 13 Drawing Sheets

(51) Int. Cl.
*H01L 29/161* (2006.01)
*H01L 29/20* (2006.01)
*H01L 29/78* (2006.01)

(58) Field of Classification Search
CPC ......... H01L 29/41791; H01L 29/66795; H01L 29/7831; H01L 29/785
See application file for complete search history.

(56) References Cited

U.S. PATENT DOCUMENTS

| | | |
|---|---|---|
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,674,413 B1 | 3/2014 | Chi |
| 8,680,576 B2 | 3/2014 | Ching et al. |
| 8,716,156 B1 | 5/2014 | Pawlak et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Pemg et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 2011/0068407 A1 | 3/2011 | Yeh et al. |
| 2013/0011983 A1 | 1/2013 | Tsai et al. |
| 2013/0175659 A1 | 7/2013 | Liu |
| 2013/0270612 A1* | 10/2013 | Chien ............... H01L 29/66795 257/288 |
| 2014/0231871 A1* | 8/2014 | Goel ..................... H01L 21/845 257/190 |
| 2014/0252412 A1 | 9/2014 | Tsai et al. |
| 2014/0252467 A1 | 9/2014 | Lee et al. |
| 2016/0141288 A1* | 5/2016 | Weng ................. H01L 21/8258 257/192 |

OTHER PUBLICATIONS

Notice of Allowance U.S. Appl. No. 14/815,722 dated Oct. 28, 2016.
Office Action Korean Patent Application No. 10-2015-0156860 dated Nov. 29, 2016.
Notification of Reason for Refusal Korean Patent Application No. 10-2015-0156860 dated May 15, 2017 with English translation.
Notice of Allowance issued in corresponding Korean Application No. 10-2015-0156860, dated Sep. 8, 2017; with English translation.
Pillarisetty, R. et al., "High Mobility Strained Germanium Quantum Well Field Effect Transistor as the P-Channel Device Option for Low Power (Vcc=0.5 V) III-V CMOS Architecture", Electron Devices Meeting (IEDM), 2010 IEEE International, Publication Year: 2010, pp. 6.7.1.

* cited by examiner

SEMICONDUCTOR DEVICE INCLUDING FIN STRUCTURES DISPOSED OVER BUFFER STRUCTURES

CROSS-REFERENCE TO RELATED APPLICATION

This Application is a Divisional Application of U.S. Ser. No. 14/815,722 filed Jul. 31, 2015, the subject matter of which is incorporated herein by reference in entirety.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin devices (e.g., wrapping) utilizing the advantage of the increased surface area of the channel and source/drain regions to produce faster, more reliable and better-controlled semiconductor transistor devices. In Fin FET devices, the upper portion of the fin structure functions as a channel, while the lower portion of the fin structure functions as a well. In some Fin FETs, the fin structures may include a buffer layer providing appropriate stress to the channel layer to enhance carrier mobility in the channel layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
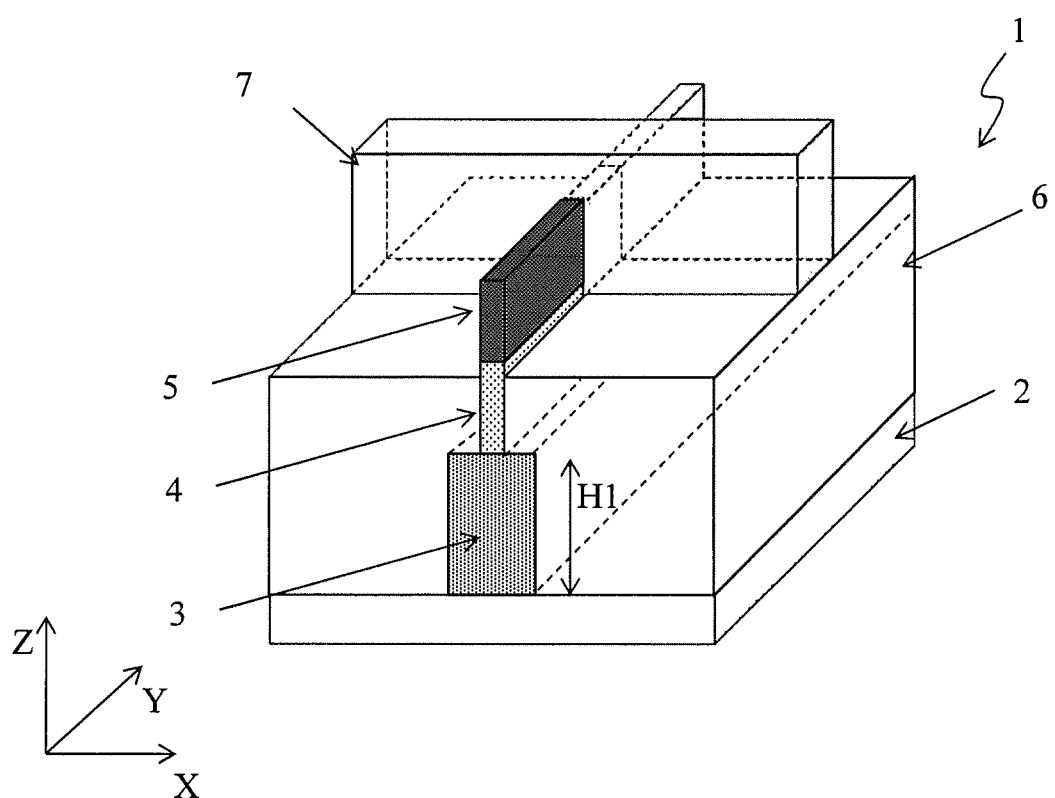
FIG. 1A is an exemplary perspective view of a semiconductor FET device having a fin structure (Fin FET) according to one embodiment of the present disclosure.

FIG. 1A is an exemplary perspective view of a semiconductor FET device having a fin structure (Fin FET) formed over a buffer structure according to one embodiment of the present disclosure. In these figures, some layers/features are omitted for simplification.

The Fin FET device 1 includes, among other features, a substrate 2, a first epitaxial layer functioning as a buffer structure 3, a fin structure 5, which functions as a channel layer of the Fin FET device 1, disposed over the buffer structure 3, an isolation insulating layer 6 and a gate structure 7.

In FIG. 1A, one fin structure 5 is disposed over the substrate 2. However, the number of the fin structures is not limited to one. The numbers of the fin structure (and the first epitaxial layer 3) may be two or more. In addition, one of more dummy fin structures may be disposed adjacent both sides of the fin structure 5 to improve pattern fidelity in patterning processes.

The first epitaxial layer 3 functions as a buffer structure to relax strains caused by lattice mismatch between the substrate 2 and the fin structure 5, and to apply an appropriate stress to the fin structure 5. The buffer structure 3 also has a different lattice constant than the substrate 2. In some embodiments, a second epitaxial layer 4, which functions as a barrier layer, may be disposed between the first epitaxial (buffer) layer 3 and the fin structure 5.

In the present disclosure, the buffer structure 3 has a fin-like structure extending in the same direction (Y direction) as the fin structure 5. The fin-like structure includes a fin structure, a rectangular parallelepiped shape, a stripe shape or a long and thin pillar shape. As shown in FIG. 1A, the side surfaces and part of the upper surface of the buffer structure 3 are covered by the isolation insulating layer 6.

Figure 1B:
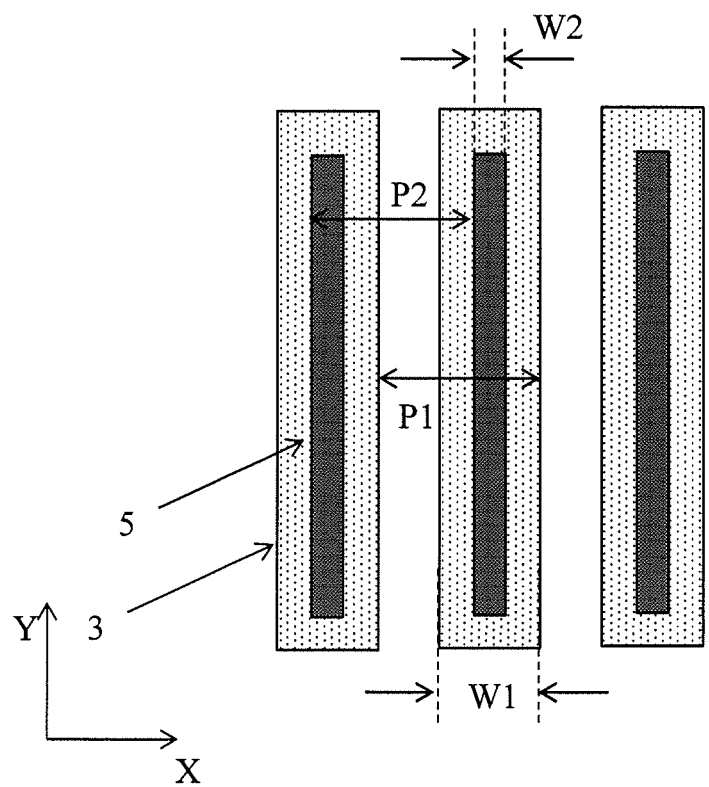
FIGS. 1B-1D are exemplary planar views of the Fin FET device according to some embodiments of the present disclosure.

In this regard, the buffer structure 3 should be distinguished over a uniform blanket layer formed over the entire surface of the substrate 2. In the present disclosure, plural and separate buffer structures 3 are disposed over the substrate 2, as shown in FIG. 1B, which is an exemplary planar view of the Fin FET device according to one embodiment of the present disclosure. If a uniform blanket layer is formed over the entire surface of the substrate 2, a lot of defects (e.g., more than $1 \times 10^3$ cm$^{-3}$), such as lattice dislocations, would be induced in the blanket layer because of lattice mismatch between the substrate and the buffer structure. In particular, when the thickness of the blanket layer is large, more defects would be induced. In contrast, in the present embodiment, since plural and separate buffer structures 3, which have a fin-like structure, are disposed over the substrate 2, the defects contained in each of the buffer structure can be reduced to less than $1 \times 10^3$ cm$^{-3}$ and may be less than $1 \times 10^2$ cm$^{-3}$, in some embodiments. In other embodiment, the buffer structure is substantially defect free.

Figure 1C:
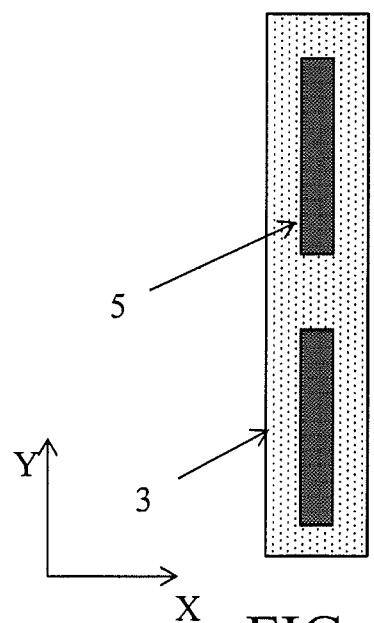
Figure 1D:
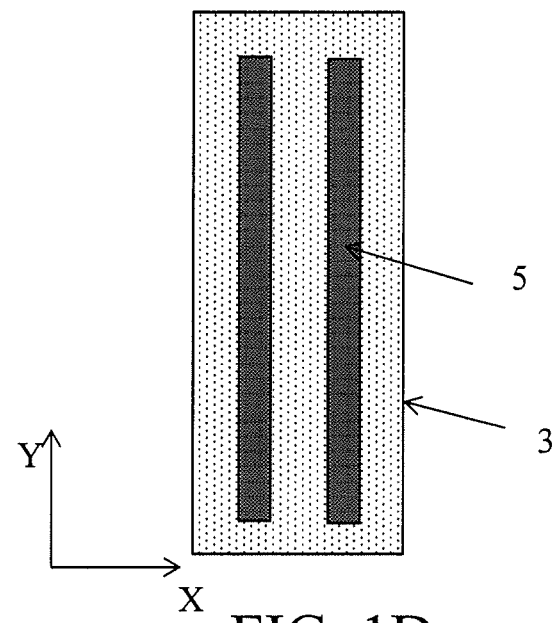

As shown in FIG. 1A, one fin structure 5 is disposed over one buffer structure 3 along the Y direction. The number of fin structures disposed over one buffer structure along the Y direction is not limited to one and more than one fin structures 5 may be disposed over the buffer structure 3 along the Y direction, as shown in FIG. 1C. In other words, the fin structure 5 is divided into multiple fin structures along the Y direction, which are aligned along the Y direction. In FIG. 1A, the number of fin structures disposed over one buffer structure 3 along the X direction is also one. However, the number of fin structures disposed over one buffer structure along the X direction is not limited to one and more than one fin structures 5 may be disposed over the buffer structure 3 along the X direction, as shown in FIG. 1D. In other words, plural fin structures 5 are disposed in parallel with each other in the X direction. In such a case, however, the width of the buffer structure in the X direction would become large, and may cause defects in the buffer structure 3.

In some embodiments of the present disclosure, the width W1 of the buffer structure 3 is about equal to or more than twice of the width W2 of the fin structure 5 (W1≥W2) to apply a sufficient amount of stress from the buffer structure 3 to the fin structure (channel layer) 5. The width W1 of the buffer structure 3 is equal to or less than H1×⅓, where H1 is the height of the buffer structure from the substrate 2. When the width W1 is more than this value, more defects would be induced in the buffer structure. The width W1 of the buffer structure 3 is in a range of about 10 nm to about 100 nm in some embodiments, and may be in a range of about 15 nm to about 30 nm in other embodiments. The width W2 of the fin structure 5 is in a range of about 3 nm to about 20 nm in some embodiments, and may be in a range of about 5 nm to about 10 nm in other embodiments. The widths W1 and W2 are measured at the interface between the buffer structure 3 and the fin structure 5, where an upper surface of the buffer structure is in contact with a bottom of the fin structure, when no second epitaxial layer 4 is formed. When the second epitaxial layer 4 is formed, the width W1 is measured at the interface between the buffer structure and the second epitaxial layer and the width W2 is measured at the interface between the fin structure and the second epitaxial layer. Thus, as shown in FIG. 1A, part of the upper surface of the buffer structure 3 is not covered by the fin structure 5 or the second epitaxial layer 4. The pitch P1 of plural buffer structures 3 is in a range of about 20 nm to about 200 nm in some embodiments, and may be in a range of about 25 nm to about 40 nm in other embodiments. The pitch P2 of plural fin structures 5 is in a range of about 10 nm to about 100 nm in some embodiments, and may be in a range of about 15 nm to about 30 nm in other embodiments. The height H1 of the buffer structure 3 is in a range of about 30 nm to about 300 nm in some embodiments, and may be in a range of about 45 nm to about 90 nm in other embodiments.

In one embodiment, the substrate 2 is a silicon substrate. Alternatively, the substrate 2 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 2 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 2. The substrate 2 may include various regions that have been suitably doped with impurities (e.g., p-type or n-type conductivity).

In one embodiment, the buffer structure 3 is made of a silicon compound, such as a $Si_{1-x}Ge_x$. The value x of $Si_{1-x}Ge_x$ may be in a range of about 0.2 to 0.4 in some embodiments. The value x is constant in the thickness direction (Z direction) in some embodiments, and may be graded in other embodiments. In at least one embodiment, the value x may increase from the substrate side. The value x may change linearly or in a stepwise manner. Hereinafter, $Si_{1-x}Ge_x$ may be simply referred to as SiGe. The buffer structure 3 may include multiple semiconductor layers.

The material of the buffer structure 3 for an n-channel FET may be the same as or may be different from that for a p-channel FET. For an n-channel FET, the buffer structure 3 may include SiGe with a Ge content of less than 50% when the channel layer is Si, or a III-V compound, such as InGaAs when the channel layer is made of a III-V compound semiconductor. For a p-channel FET, the buffer structure 3 may include be SiGe when the channel layer is made of SiGe or Ge, or a III-V compound when the channel layer is made of a III-V compound semiconductor.

The fin structure (channel layer) 5 is made of, for example, silicon or $Si_{1-x}Ge_x$, where x is in a range of about 0 to about 0.2, when the Fin FET is an n-channel FET. When the fin structure 5 is made of $Si_{1-x}Ge_x$, the silicon content of the fin structure 5 is greater than the silicon content of the buffer structure 3. When the Fin FET is a p-channel FET, the fin structure 5 is made of, for example, $Si_{1-x}Ge_x$, where x is in a range of about 0.3 to about 1.0 or Ge. When the fin structure 5 is made of $Si_{1-x}Ge_x$, the germanium content of the fin structure 5 is greater than the germanium content of the buffer structure 3.

When the second epitaxial layer (barrier layer) 4 is disposed between the buffer structure 4 and the fin structure 5, the barrier layer 4 is made of, for example, $Si_{1-x}Ge_x$, where x is in a range of about 0 to about 0.2, when the Fin FET is an n-channel FET. The silicon content of the fin structure 5 is equal to or greater than the silicon content of the barrier layer 4. When the Fin FET is a p-channel FET, the barrier layer 4 is made of, for example, $Si_{1-x}Ge_x$, where x is in a range of about 0.1 to about 0.6. The germanium content of the barrier layer 4 is equal to or smaller than the germanium content of the fin structure 5. The barrier layer 4 may be considered as a part of the fin structure 5 because of the fabrication processes described below.

Other materials different from the above embodiments may be employed. For example, the substrate 2 may be made of Ge or Ge-based compound. The buffer structure may be made of $Si_{1-x}Ge_x$, where x is in a range of about 0.6 to about 0.8. The value x is constant in the thickness direction (Z direction) in some embodiments, and may be graded in other embodiments. In at least one embodiment, the value x may increase from the substrate side. The value x may change linearly or in a stepwise manner. For an n-channel FET, the fin structure 5 may include InGaAs and the barrier layer 4 may include GaAs. For a p-channel FET, the fin structure 5 may include Ge or $Si_{1-x}Ge_x$, where x is in a range of about 0.8 to about 1.0 and the barrier layer 4 may include $Si_{1-x}Ge_x$, where x is smaller than the x of the fin structure 5 and may be in a range of about 0.6 to about 0.8.

The isolation insulating layer 6 (or so-called "shallow-trench-isolation (STI)" layer) including one or more layers of insulating material. The insulating material for the isolation insulating layer 50 may include silicon oxide, silicon nitride, silicon oxynitride (SiON), SiOCN, fluoride-doped silicate glass (FSG), or a low-K dielectric material.

The fin structure 5 protruding from the isolation insulating layer 6 is covered by a gate structure 7 including a dielectric layer and a gate electrode. Part of the fin structure 5 not covered by the gate structure 7 functions as a source and/or drain of the FET (see FIG. 1A).

In certain embodiments, the gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode includes one or more layer of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-first or replacement gate (gate-last) methodology.

In certain embodiments of the present disclosure, one or more work function adjustment layers (not shown) may be interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

Source and drain regions are also formed in the fin structure 5 not covered by the gate structure 7, by appropriately doping impurities in the source and drain regions. An alloy of Si or Ge and a metal such as Co, Ni, W, Ti or Ta may be formed on the source and drain regions.

Further, the gate structure 7 and the source/drain regions are covered by an interlayer insulating film (not shown), and necessary wirings and/or via/contact holes are disposed so as to complete the semiconductor device.

FIGS. 2-13 show cross sectional views of exemplary sequential processes of manufacturing the Fin FET device according to one embodiment of the present disclosure. It is understood that additional operations can be provided before, during, and after processes shown by FIGS. 2-13, and some of the operations described below can be replaced or eliminated, for additional embodiments of the method. The order of the operations/processes may be interchangeable.

Figure 2:
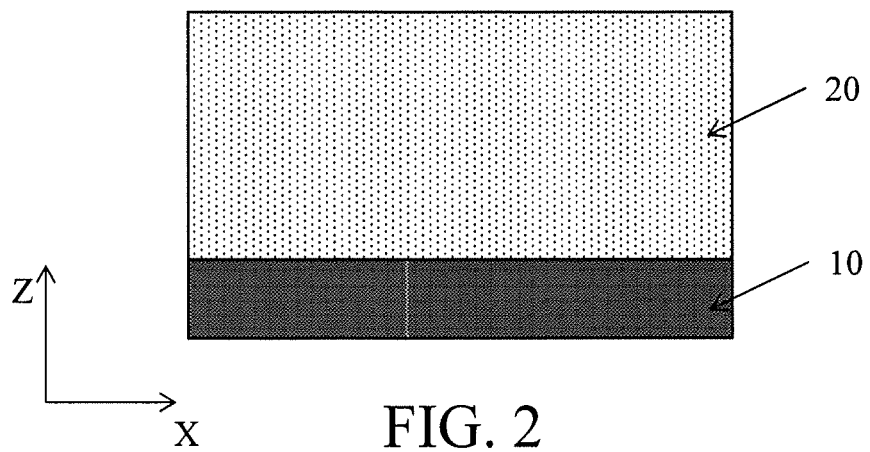
FIGS. 2-13 show exemplary sequential processes for manufacturing the Fin FET device according to one embodiment of the present disclosure.

As shown in FIG. 2, an first insulating layer 20 is formed over a substrate 10. The first insulating layer 20 is made of, for example, silicon oxide in one embodiment. The first insulating layer 20 may be one or more layers of dielectric material such as silicon oxide, silicon nitride or silicon oxynitride. The substrate is any suitable material as set forth above. In this embodiment, the substrate 10 is a silicon substrate. The thickness of the first insulating layer 20 is in a range of about 30 nm to about 300 nm in some embodiments, and may be in a range of about 45 nm to about 90 nm in other embodiments. The thickness of the first insulating layer 20 substantially defines the height H1 of the buffer structure.

Figure 3:
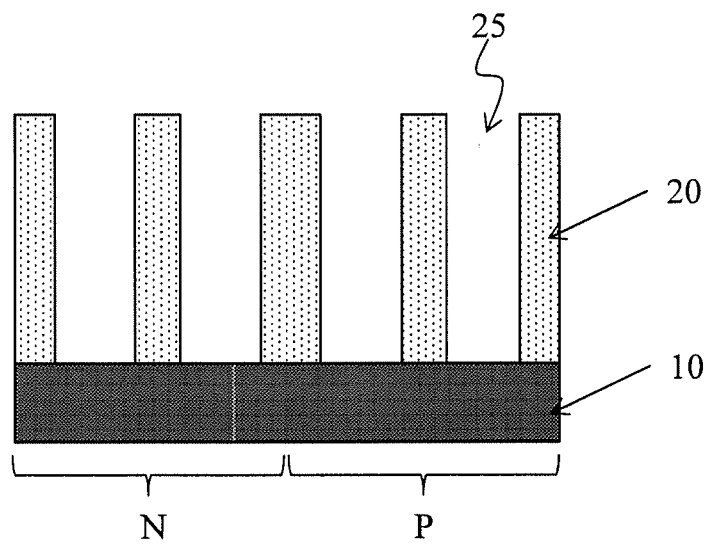

As shown in FIG. 3, the first insulating layer 20 is patterned to form openings 25 by patterning operations including a lithography process and an etching process. The width of the openings 25 is in a range of about 10 nm to about 100 nm in some embodiments, and may be in a range of about 15 nm to about 30 nm in other embodiments.

In FIG. 3, two openings are formed in an N region for an n-type FET to be formed, and two opening are also formed in a P region for a p-type FET to be formed. However, the numbers of the openings is not limited to two, and may be as small as one, or more than two.

Figure 4:
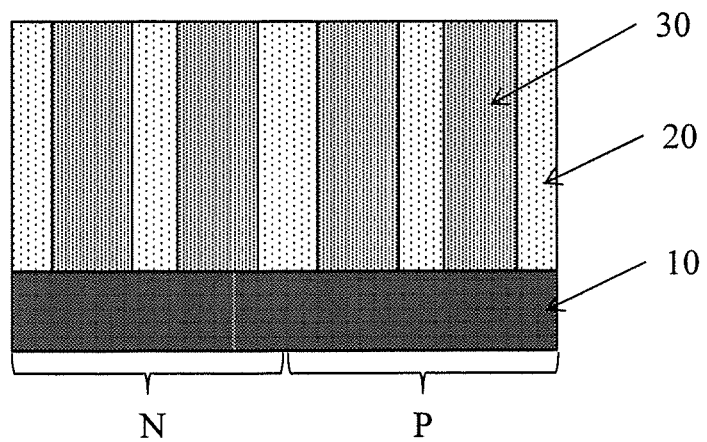

As shown in FIG. 4, the openings 25 are filled with a first semiconductor material. The first semiconductor material is epitaxially formed over the substrate 10 and above the upper surface of the first insulating layer 20. Then, a planarization operation, such as chemical mechanical polishing (CMP) and/or an etch-back process, is performed to remove the portion of the first semiconductor material above the upper surface of the first insulating layer 20, thereby forming the buffer structure 30 as shown in FIG. 4. In some embodiments, the first semiconductor material is epitaxially formed in the openings at a level below the upper surface of the first insulating layer 20, and then a planarization operation is performed to remove the portion of the first insulating layer 20 above the upper surface of the first semiconductor material. The first semiconductor material is any suitable semiconductor material for the buffer structure as set forth above.

If a buffer structure is formed by patterning a thick blanket layer of a semiconductor material into a fin-like shape, the defects in the blanket layer caused by lattice mismatch between the blanket layer and the substrate would remain in the buffer structure. In contrast, in this embodiment, since the plural and separate buffer structures 30 are respectively formed, the buffer structures 30 are substantially free from the defects. There is no vertical (along the Z direction) patterning of the semiconductor material constituting the buffer structure to form the buffer structure in this embodiment.

In this embodiment, the same semiconductor material is used for the N region and the P region. If different semiconductor materials are used for the N and P regions, the operations shown in FIGS. 3 and 4 are performed separately for the N region and the P region. For example, the openings 25 are formed and the semiconductor material is filled in the openings in the N region, and then the N region is covered by a protective layer. After that, the openings 25 are formed and a different semiconductor material is filled in the openings in the P region. If necessary, the protective layer is removed.

Figure 5:
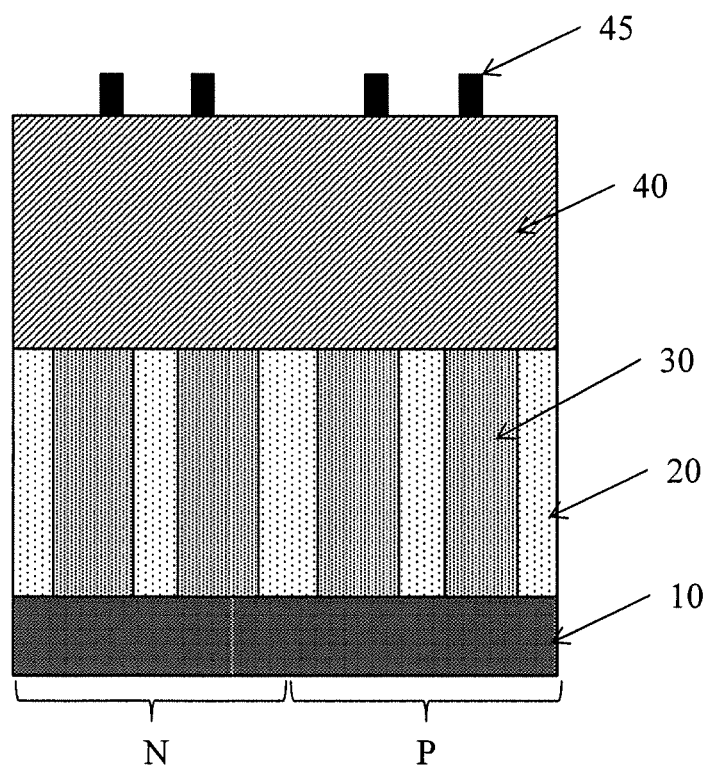

As shown in FIG. 5, after the buffer structures 30 are formed, a first dummy layer 40 is formed over the buffer structures 30 and the first insulating layer 20. The dummy layer 40 includes a material which has sufficient etching selectivity against the first insulating layer 20. Silicon or silicon nitride may be used as the first dummy layer 40 in one embodiment. The thickness of the first dummy layer 40 is in a range of about 30 nm to about 300 nm in some embodiments, and may be in a range of about 40 nm to about 80 nm in other embodiments. In some embodiments, an intermediate layer, such as a silicon oxide layer with thickness of about 1 nm to about 10 nm, may be formed before forming the first dummy layer 40. After forming the buffer structure 30, an anneal operation may be performed.

A mask pattern 45 is subsequently formed over the first dummy layer 40. The mask pattern is a resist pattern in one embodiment. A hard mask may be used as the mask pattern 45 in other embodiments. The width of the mask pattern 45 is in a range of about 3 nm to about 20 nm in some embodiments, and may be in a range of about 5 nm to about 10 nm in other embodiments. Since a pitch or a space of mask pattern 45 is not necessarily the same as a pitch or a space of the buffer structures 30, the mask pattern 45 may not be aligned to the center of the corresponding buffer structure 30.

Figure 6:
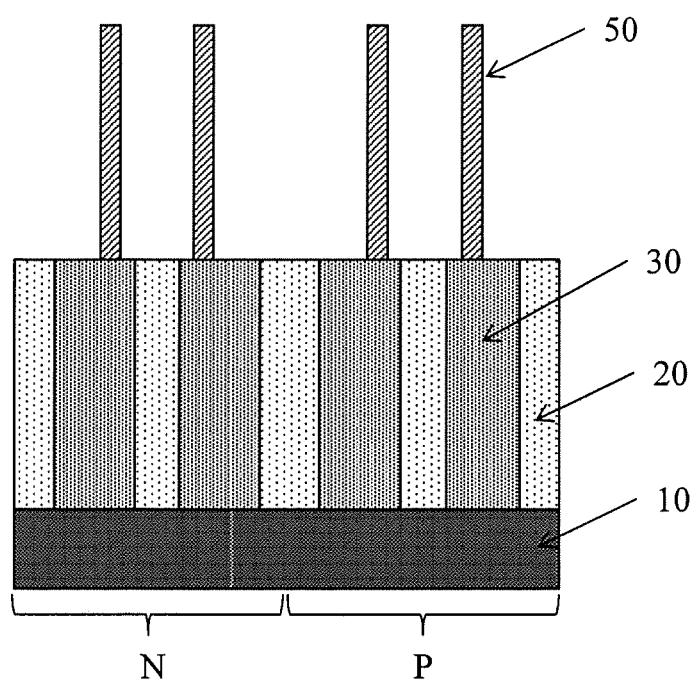

As shown in FIG. 6, by using the mask pattern 45, the first dummy layer 40 is patterned into dummy fin structures 50. The patterning operation includes dry etching and/or wet etching.

Figure 7:
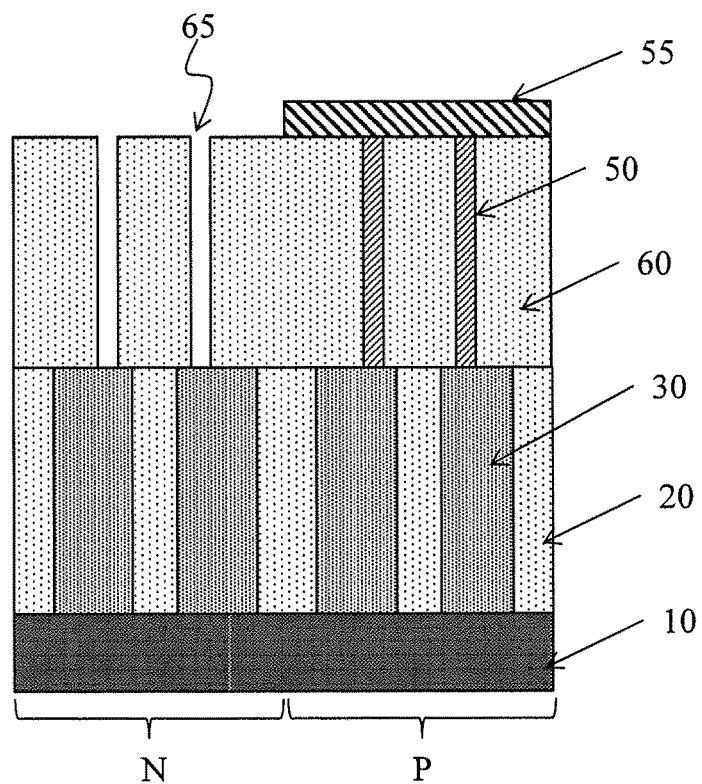

Then, a second insulating layer 60 is formed over the dummy fin structures 50, the buffer structure 30 and the first insulating layer 20 so that the dummy fin structures 50 are embedded in the second insulating layer 60, as shown in FIG. 7.

The second insulating layer 60 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once.

Then, a planarization operation is performed to remove portion of the second insulating layer 40 above the upper surface of the dummy fin structures 50.

As shown in FIG. 7, the P region is covered by a protective layer 55 and the fin structures 50 in the N region are removed to form openings 65 in the second insulating layer 60, thereby exposing the upper surface of the buffer structure 30. The protective layer 55 is made of a material which has sufficient etching selectivity against the fin structures 50. When the fin structures 50 are made of silicon nitride, the protective layer 55 includes, for example, silicon oxide. When the dummy fin structures 50 are made of silicon, the protective layer 55 includes, for example, silicon oxide and/or silicon nitride. A resist pattern may be used as the protective layer 55.

Figure 8:
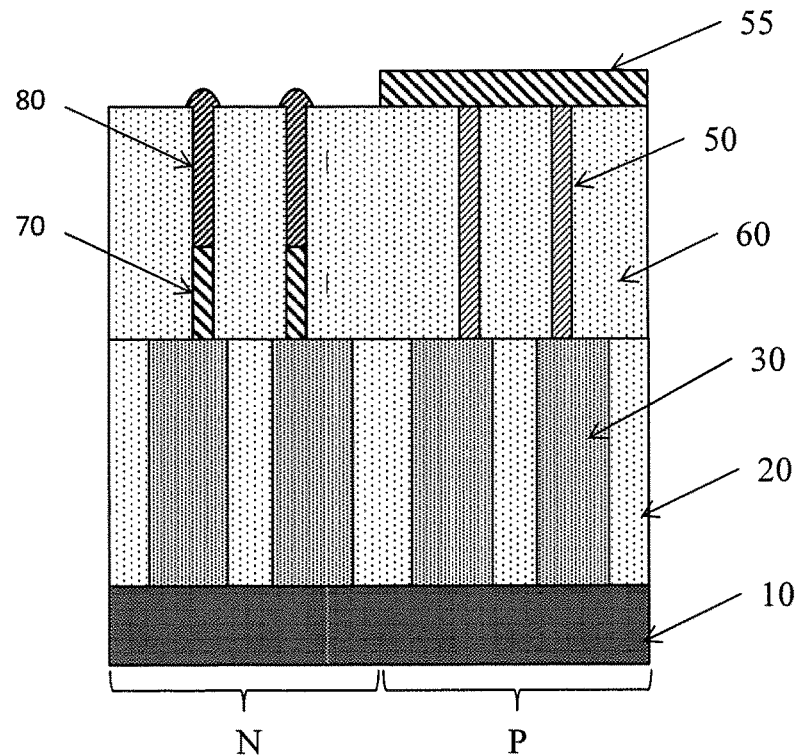

As shown in FIG. 8, a second semiconductor material 70, as a barrier layer, for n-type FETs is epitaxially formed in the openings 65 over the upper surface of the buffer structure 30 in some embodiments. As described above, the barrier layer may not be used in other embodiments. Further, a third semiconductor material 80, as a fin channel region for the n-type FETs, is epitaxially formed over the barrier layer 70. The second and third semiconductor materials are any suitable semiconductor materials as set forth above. The thickness of the barrier layer 70 is in a range of about 5 nm to about 20 nm and the thickness of the channel region 80 is in a range of about 30 nm to about 100 nm, in some embodiments. As shown in FIG. 8, the third semiconductor material may be formed over the upper surface of the second insulating layer 60.

Figure 9:
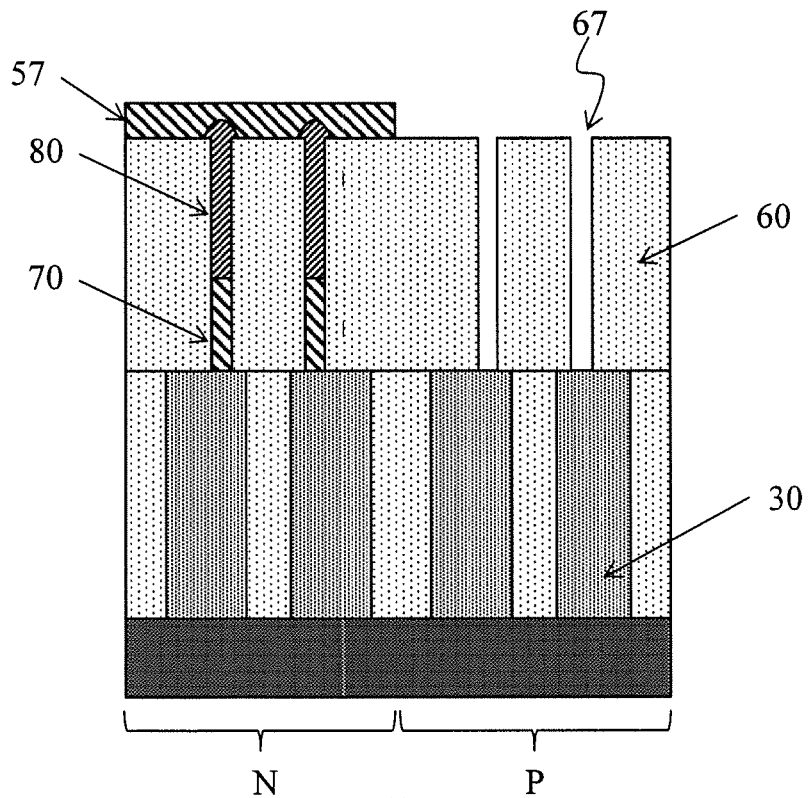

After forming the fin structures (the barrier layer 70 and the fin channel region 80) for the N region, the protective layer 55 is removed to form openings 67, and a protective layer 57 is formed to cover the N region, as shown in FIG. 9. Then, similar to FIG. 7, the dummy fin structures 50 in the P region are removed. The material for the protective layer 57 may be the same as that for the protective layer 55.

Figure 10:
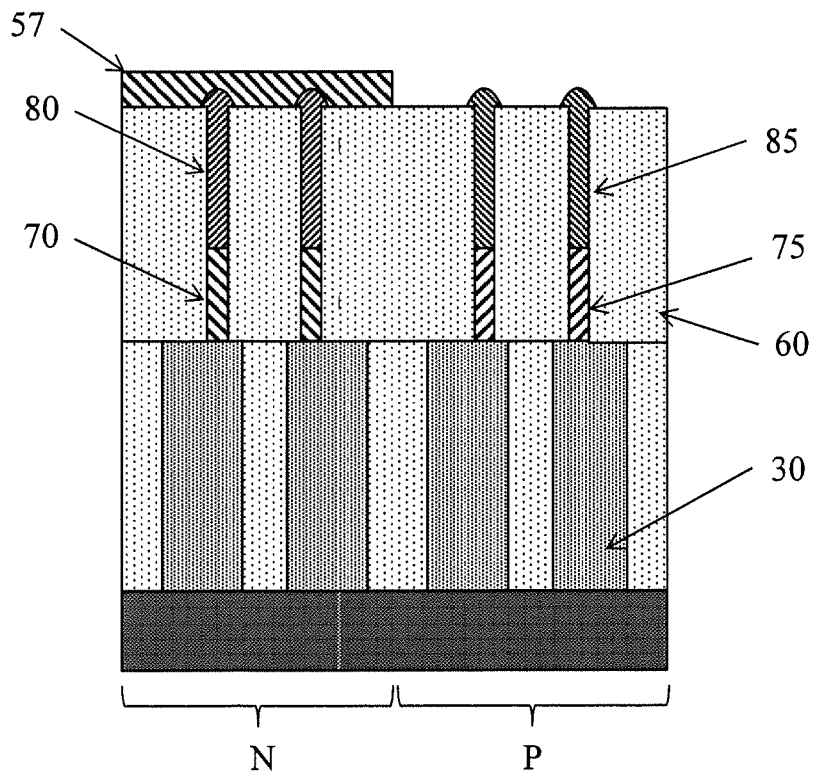

Similar to FIG. 8, a fourth semiconductor material 75, as a barrier layer, for p-type FETs is epitaxially formed in the openings 67 over the upper surface of the buffer structure 30. Further, a fifth semiconductor material 85, as a fin channel region for the p-type FETs, is epitaxially formed over the barrier layer 75. The fourth and fifth semiconductor materials are any suitable semiconductor materials as set forth above. The thickness of the barrier layer 75 is in a range of about 5 nm to about 20 nm and the thickness of the channel region 85 is in a range of in a range of about 30 nm to about 100 nm, in some embodiments. As shown in FIG. 10, the fifth semiconductor material 85 may be formed over the upper surface of the second insulating layer 60.

Figure 11:
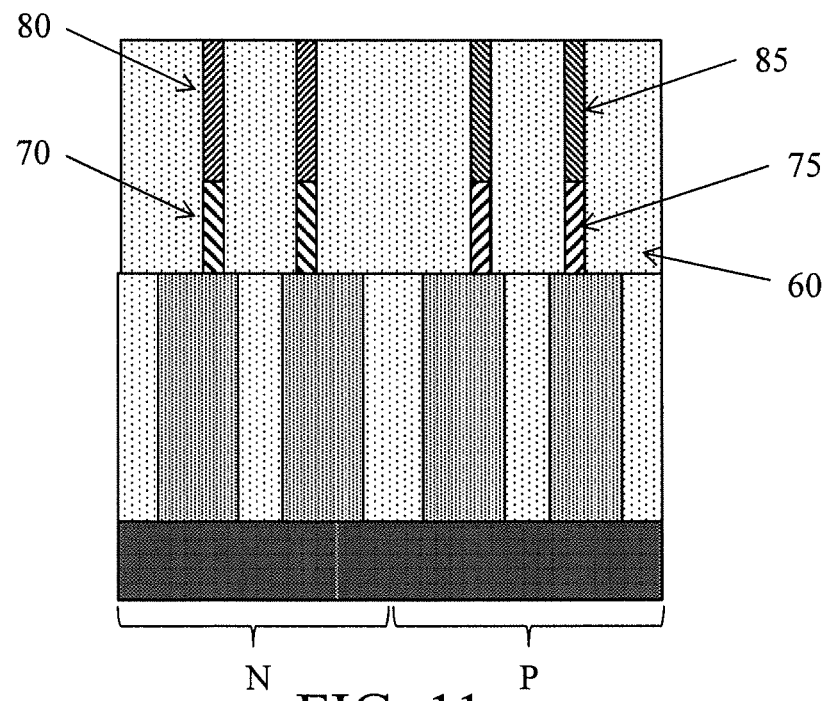

As shown in FIG. 11, the protective layer 57 and portions of the third and fifth semiconductor materials formed over the upper surface of the second insulating layer 60 are removed by, for example, a planarization operation such as CMP.

Figure 12:
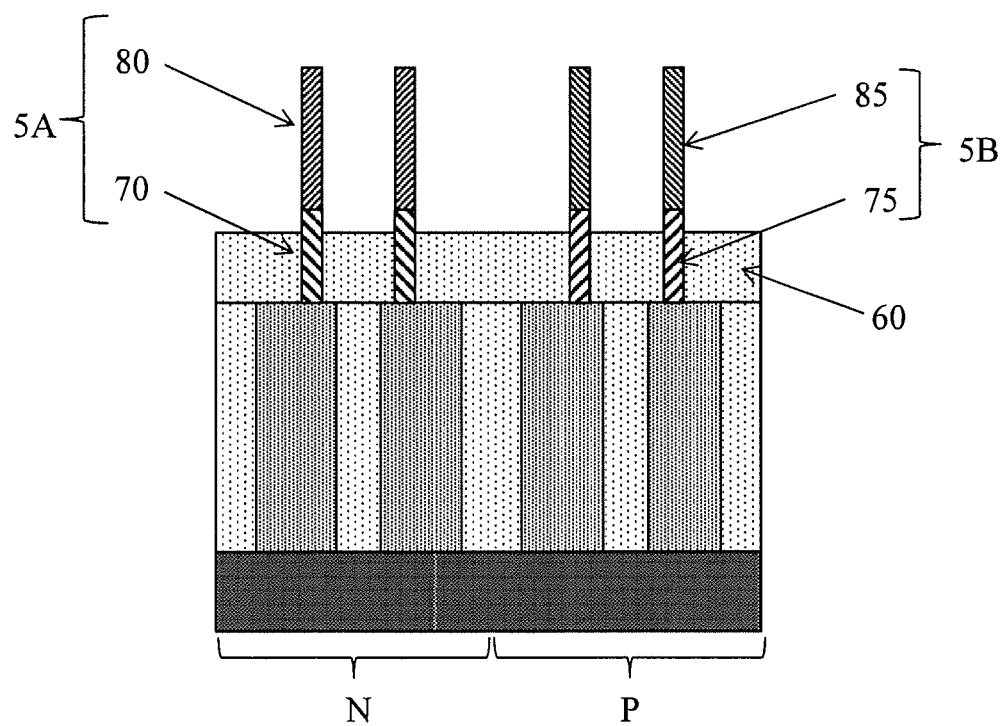

Then, as shown in FIG. 12, upper portions of the fin structures 5A (the barrier layer 70 and the fin channel region 80) and 5B (the barrier layer 75 and the fin channel region 85) are exposed by partially removing the second insulating layer 60. The second insulating layer 60 may be dry-etched by adjusting etching conditions including etching time. In one embodiment, the second insulating layer 60 is removed so that the entire channel regions 80 and 85 are exposed, and as shown in FIG. 12, an upper portion of the barrier layers 70 and 75 may be exposed by about less than 10 nm. In some embodiment, the barrier layers 70 and 75 may not be exposed from the second insulating layer 60.

Figure 13:
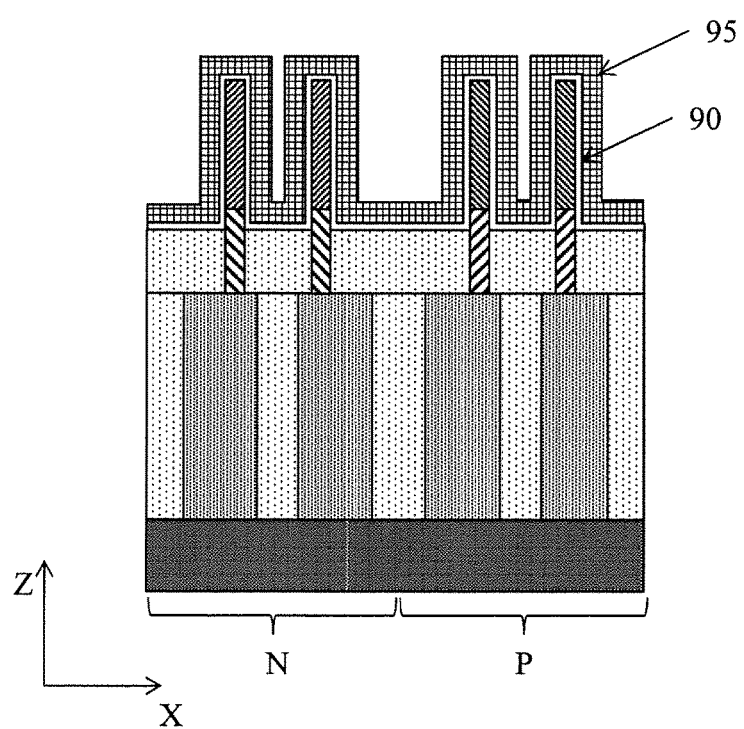

After partially exposing the fin structures 5A and 5B, a gate structure is formed over the exposed fin structures 5A and 5B, as shown in FIG. 13. The gate structure includes a gate dielectric layer 90 and a gate electrode layer 95. In some embodiments, a work function adjusting layer (not shown) may be interposed between the gate dielectric layer 90 and the gate electrode layer 95. The materials for the gate dielectric layer 90 and the gate electrode layer 95 are any suitable materials as set forth above. The materials of the gate structures for the n-type FET and the p-type FET are the same in one embodiment, and may be different from each other in other embodiments.

The gate structures may be fabricated by a gate-first technology, in which, for example, poly silicon is used as the gate electrode material, or may be fabricated by a gate-replacement technology, in which, for example, a dummy poly silicon gate is replaced with a metal gate electrode material. Source and drain regions are also fabricated by using, for example, raised epitaxial structures with strain materials.

It is understood that the Fin FETs may undergo further CMOS processes to form various features such as contacts/vias, interconnect metal layers, dielectric layers, passivation layers, etc.

FIGS. 14-17 show cross sectional views of other exemplary sequential processes of the Fin FET device according to another embodiment of the present disclosure. It is understood that additional operations can be provided before, during, and after processes shown by FIGS. 14-17, and some of the operations described below can be replaced or eliminated, in additional embodiments of the method. The order of the operations/processes may be interchangeable.

Figure 14:
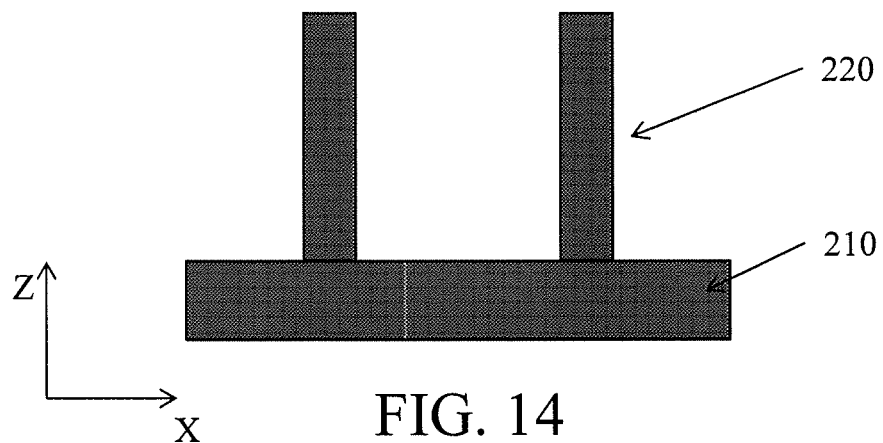
FIGS. 14-26 show exemplary sequential processes for manufacturing the Fin FET device according to another embodiment of the present disclosure.

As shown in FIG. 14, dummy fin structures 220 are formed over a substrate 210. To fabricate a fin structure, a mask layer is formed over the substrate 210 by, for example, a thermal oxidation process and/or a chemical vapor deposition (CVD) process. The substrate 210 is, for example, a silicon substrate. The mask layer includes, for example, a pad oxide (e.g., silicon oxide) layer and a silicon nitride mask layer in some embodiments. The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 1 nm to about 50 nm in some embodiments. In certain embodiments, the width of the hard mask patterns is in a range of about 3 nm to about 10 nm.

By using the hard mask pattern as an etching mask, the substrate 210 is patterned into dummy fin structures 220 by trench etching using a dry etching method and/or a wet etching method. A height in the Z direction of the dummy fin structure 220 is in a range of about 30 nm to about 300 nm. In certain embodiments, the height is in a range of about 50 nm to about 100 nm. When the heights of the fin structures are not uniform, the height from the substrate may be measured from the plane that corresponds to the average heights of the fin structures. The width of the fin structures is in a range of about 1 nm to about 50 nm in some embodiments. In certain embodiments, the width of the hard mask patterns is in a range of about 3 nm to about 10 nm.

In this embodiment, a bulk silicon wafer is used as a starting material and constitutes the substrate 210. However, in some embodiments, other types of substrate may be used as the substrate 210. For example, a silicon-on-insulator (SOI) wafer may be used as a starting material, and the insulator layer of the SOI wafer constitutes the substrate 210 and the silicon layer of the SOI wafer is used for the dummy fin structures 220.

As shown in FIG. 14, two dummy fin structures 220 are disposed adjacent to each other in the X direction. However, the number of the fin structures is not limited to two. The numbers may be one, three, four or five or more. In addition, one of more dummy fin structures may be disposed adjacent to both sides of the dummy fin structures 220 to improve pattern fidelity in patterning processes.

Figure 15:
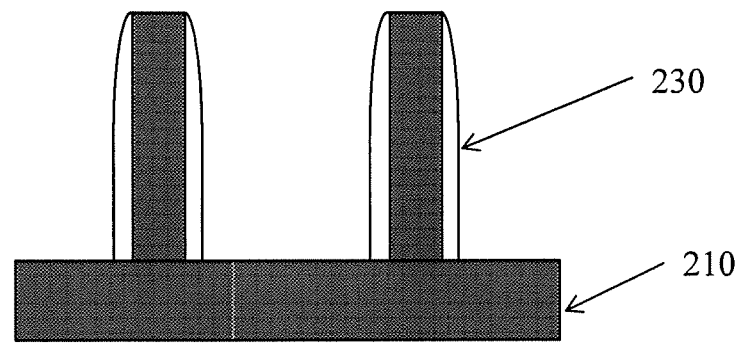

As shown in FIG. 15, side wall spacers 230 are formed over the dummy fin structures 220. The side wall spacers include, for example, silicon nitride in one embodiment. In some embodiments, pad oxide layer may be disposed between the dummy fin structures 220 and the silicon nitride layer. The side wall spacers 230 may be formed by known techniques and the upper surface of the dummy fin structures 220 and the upper surface of the substrate (the bottom of the trenches) 210 are exposed.

Figure 16:
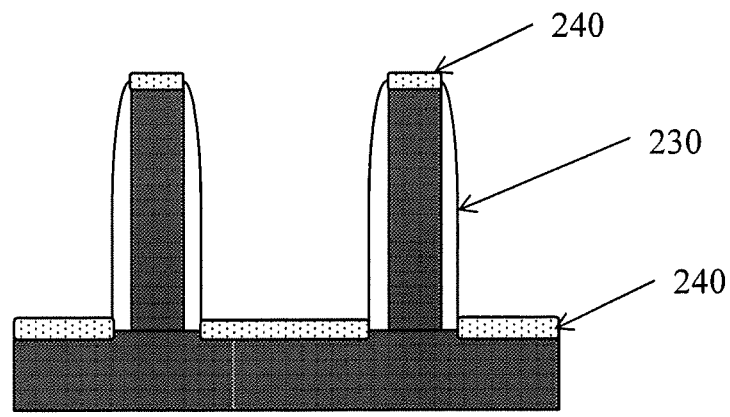

As shown in FIG. 16, a cover layer 240 made of, for example, an oxide layer, is formed over the exposed upper surface of the dummy fin structures 220 and the exposed upper surface of the substrate 210 (the bottom of the trenches). The oxide layer 240 is formed by, for example, thermal oxidation.

Figure 17:
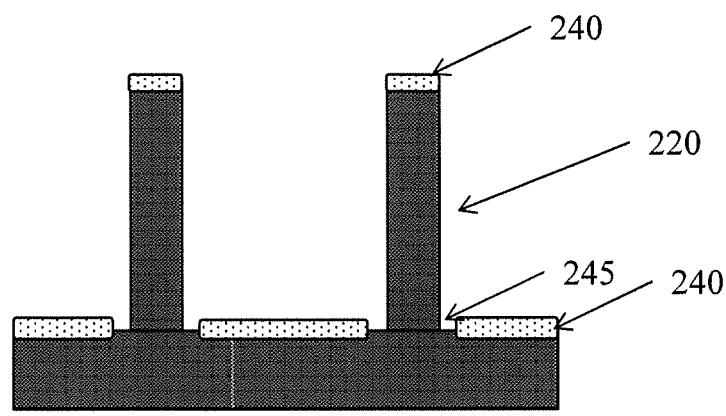

After forming the oxide layer 240, the side wall spacers 230 are removed by dry etching and/or wet etching, as shown in FIG. 17. If the side wall spacers 230 are made of silicon nitride, the silicon nitride may be removed by wet etching using $H_3PO_4$. By removing the side wall spacers 230, the side walls of the dummy fin structures 220 and part 245 of the upper surface of the substrate (the bottom of the trenches) are exposed.

Figure 18:
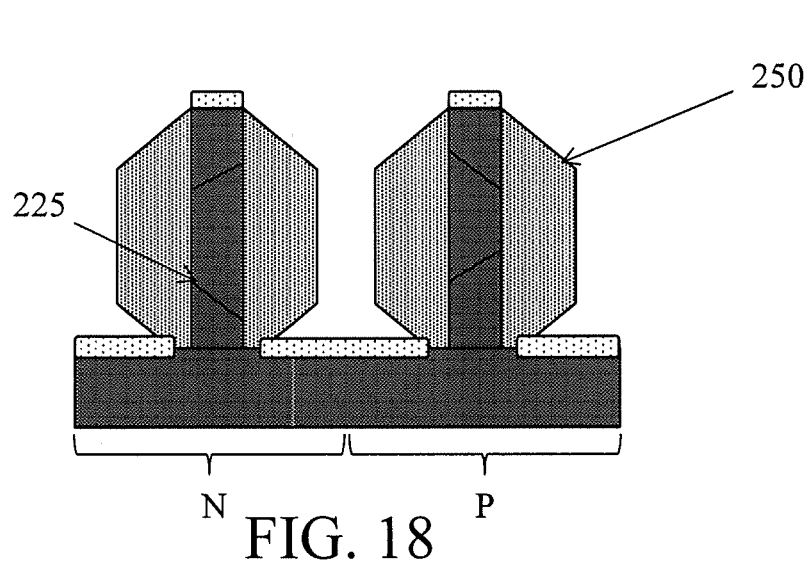

Then, as shown in FIG. 18, a semiconductor material 250 is epitaxially formed over the exposed side walls of the dummy fin structures 220 and the exposed part 245 of the upper surface of the substrate (the bottom of the trenches). The epitaxially formed semiconductor material 250 becomes a buffer structure. The material for the epitaxial semiconductor material layer 250 is any suitable material as set forth above. The width of the epitaxial semiconductor material 250 along the X direction measured from the surface of the side wall of the dummy fin structure 220 is in a range of about 10 nm to about 100 nm in some embodiments, and may be in a range of about 15 nm to about 30 nm in other embodiments.

In one embodiment, the substrate is a (100) silicon substrate and the side walls of the dummy fin structures have (110) surfaces. Accordingly, the epitaxial semiconductor layer 250 is formed to have oblique faces (111) with respect to the (110) and (100) surfaces.

By epitaxially growing the semiconductor material 250 mainly on the side wall of the dummy fin structure and on a small area of the exposed part 245 of the upper surface of the substrate, the substrate 210 is substantially free from a stress in the lateral directions that would be otherwise caused by lattice mismatch between the substrate (e.g., Si) and the semiconductor material (e.g., SiGe) 250. Along the vertical direction, defects 225 such as dislocations concentrate into the dummy fin structures 220 because of their very small size compared with the substrate 210.

After forming the epitaxial semiconductor material 250, a thermal anneal operation may optionally be performed. By the optional thermal annealing, more defects 225 are confined in the dummy fin structures 220. The thermal anneal operation may be performed at a temperature in a range of about 500 to about 1200° C.

In this embodiment, the same epitaxial semiconductor material 250 is used for the N region and the P region. If different semiconductor materials are used for the N and P regions, the operations shown in FIG. 18 are performed separately for the N region and the P region. For example, the epitaxial semiconductor material is formed and the dummy fin structures in the N region, while the P region is covered by a protective layer. After the epitaxial semiconductor material is formed, the protective layer is removed and the N region is covered by a protective layer. After that, the epitaxial semiconductor material is formed on the dummy fin structures in the P region. If necessary, the protective layer is removed.

Figure 19:
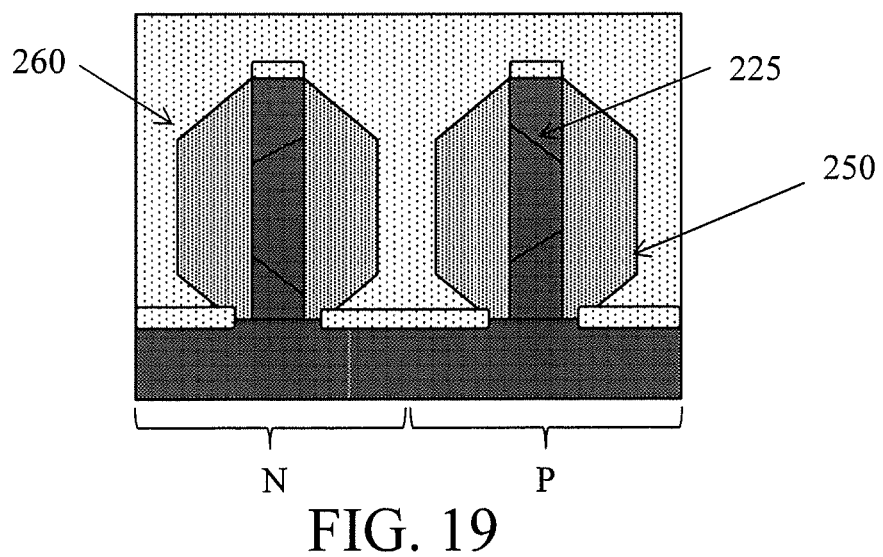

Then, as shown in FIG. 19, a first insulating layer 260 is formed so that the dummy fin structures 220 and the epitaxial semiconductor material 250 are embedded in the first insulating layer. The first insulating layer 260 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. A thermal anneal operation may be performed after forming the first insulating layer 260.

Figure 20:
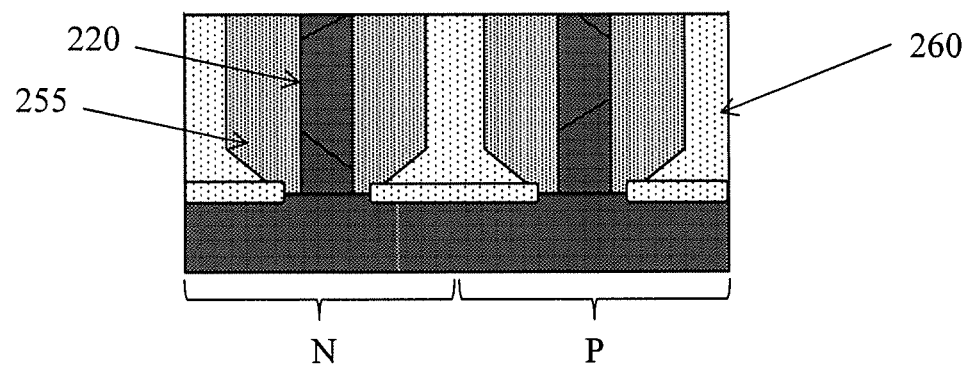

After forming the first insulating layer 260, a planarization operation such as CMP or an etch-back process is performed to remove part of the first insulating layer 260 and upper portions of the dummy fin structures 220 and the epitaxial semiconductor layer 250, thereby forming buffer structures 255, as shown in FIG. 20.

Figure 21:
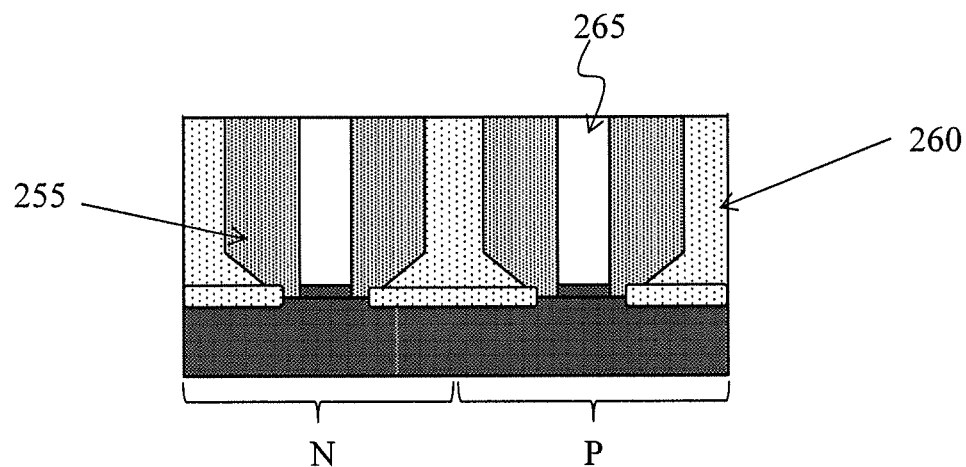

As shown in FIG. 21, the dummy fin structures 220 are removed by dry etching and/or wet etching. As described above, the defects are concentrated and confined in the dummy fin structures 220. By removing the dummy fin structures 220, the buffer structures 255 and the substrate 210 are substantially free from the defects in all directions. If a buffer structure is formed by patterning a thick blanket layer of a semiconductor material into a fin-like shape, the defects in the blanket layer caused by lattice mismatch between the blanket layer and the substrate would remain in the buffer structure. In contrast, in this embodiment, the buffer structures 255 are substantially free from the defects. There is no vertical (along the Z direction) patterning of the semiconductor material constituting the buffer structure to form the buffer structure in this embodiment.

In some embodiments, the dummy fin structures 220 may not be removed. In such a case, however, since the defects are concentrated and confined in the dummy fin structures 220, the defects in the buffer structures 255 and the substrate 210 can be suppressed compared with the case in which a thick blanket layer is patterned.

When the dummy fin structures 220 are removed, the resultant openings 265 are filled with an insulating material 270, as shown in FIG. 11. The material and processes for forming this insulating material may be the same as those for forming the first insulating layer 260.

Figure 22:
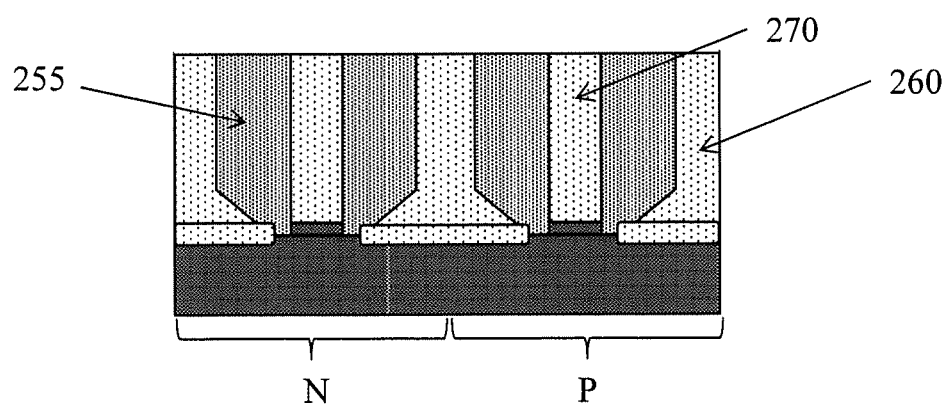
Figure 23:
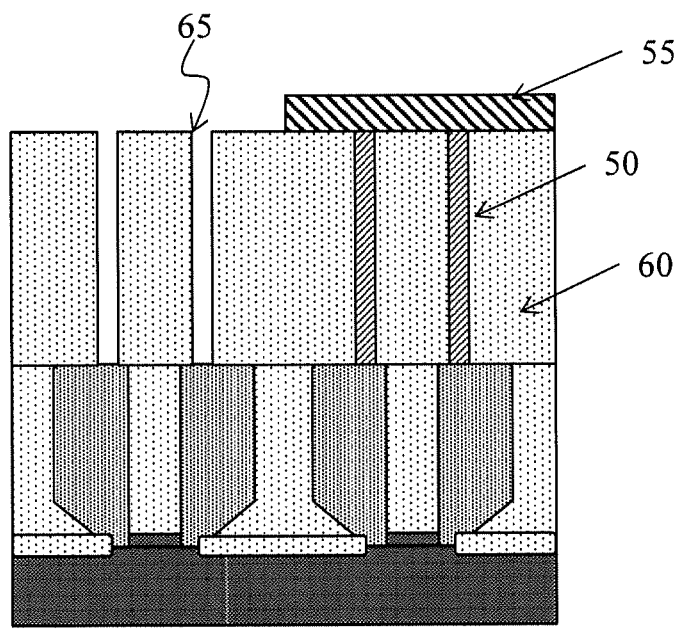
Figure 24:
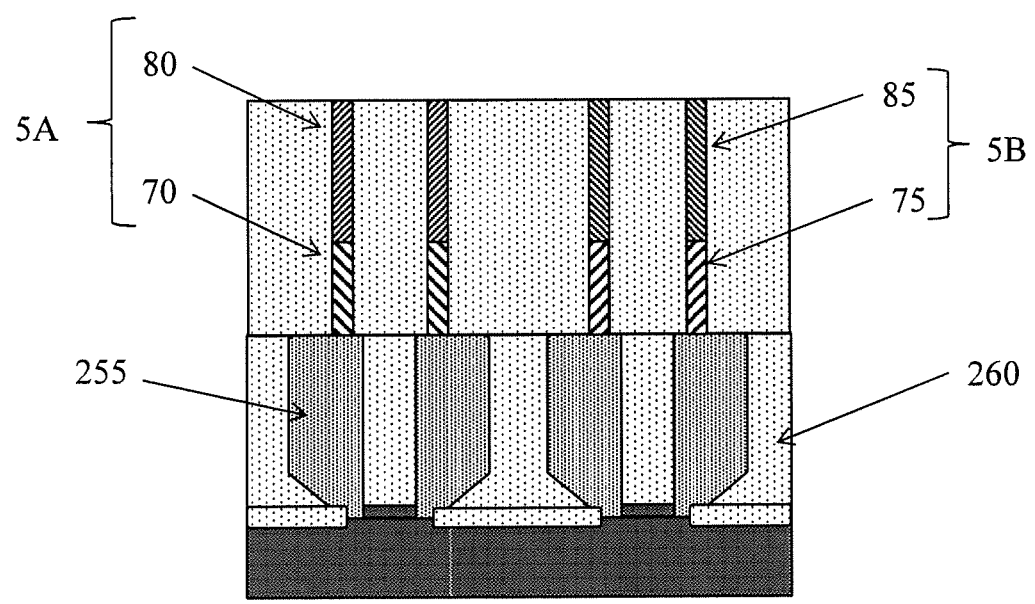
Figure 25:
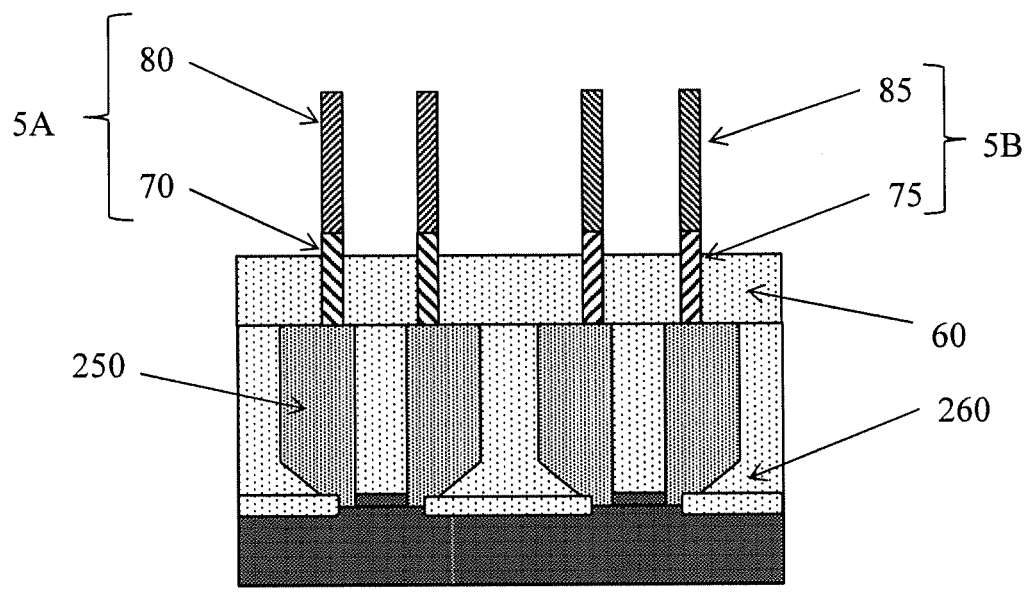
Figure 26:
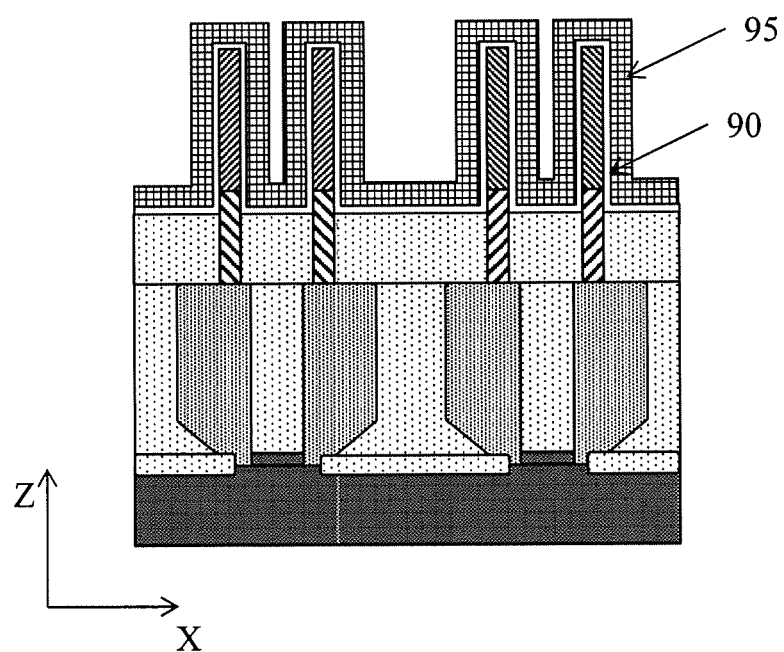

After the structure shown in FIG. 22 is formed, the same or similar operations described with FIGS. 5-7 are performed to obtain the structure of FIG. 23. Further, the same or similar operations described with FIGS. 8-11 are performed to obtain the structure of FIG. 24. Then, the same or similar operations described with FIG. 12 are performed to obtain the structure of FIG. 25, followed by the same or similar operations described with FIG. 13 are performed to obtain the structure of FIG. 26.

It is understood that the Fin FETs may undergo further CMOS processes to form various features such as contacts/vias, interconnect metal layers, dielectric layers, passivation layers, etc.

The various embodiments or examples described herein offer several advantages over the existing art. For example, in the present disclosure, since the buffer structure disposed between the substrate and the fin channel region is formed as a fin-like shape without forming a thick blanket layer, defects, such as dislocations caused by lattice mismatch, can be suppressed. Further, since the buffer structure is formed by lateral epitaxial growth over the side walls of the thin dummy fin structures, the defects can be concentrated and confined in the fin structure and therefore the buffer structure can be substantially free from the defects.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a buffer structure over a substrate. The buffer structure has a fin-shape and extends along a first direction. The buffer structure has a different lattice constant than the substrate. After forming the fin-shaped buffer structure, a fin structure is formed over an upper surface of the fin-shaped buffer structure. The width of the buffer structure along a second direction perpendicular to the first direction is greater than the width of the fin structure along the second direction measured at an interface between the buffer structure and the fin structure, where the upper surface of the buffer structure is in contact with a bottom of the fin structure.

In accordance with another aspect of the present disclosure, a method for manufacturing a semiconductor device includes forming plural buffer structures over a substrate. The buffer structures have a fin-shape and extend along a first direction and arranged in parallel with each other in a second direction crossing the first direction. The buffer structures have a different lattice constant from the substrate. After forming the fin-shaped buffer structures, a fin structure is formed over an upper surface of corresponding one of the fin-shaped buffer structures.

In accordance with another aspect of the present disclosure, a semiconductor FET device includes a buffer structure and a fin structure. The buffer structure has a fin shape, is disposed over a substrate and extends along a first direction. The fin structure includes a channel region of the FET device, is disposed on the buffer structure and extends along the first direction. The width of the buffer structure along a second direction perpendicular to the first direction is greater than the width of the fin structure along the second direction measured at an interface between the buffer structure and the fin structure. An upper surface of the buffer structure is in contact with a bottom of the fin structure at the interface.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor FET device, comprising:
a buffer structure having a fin shape and disposed over a substrate, the buffer structure extending along a first direction;
a fin structure disposed on the buffer structure, and including a lower semiconductor layer and an upper semiconductor layer including a channel region of the FET device and the fin structure extending along the first direction; and
an isolation insulating layer in which the lower semiconductor layer is embedded,
wherein a width of the buffer structure along a second direction perpendicular to the first direction is greater than a width of the fin structure along the second direction measured at an interface between the buffer structure and the fin structure, an upper surface of the buffer structure being in contact with a bottom of the fin structure at the interface.

2. The semiconductor FET device of claim 1, wherein the buffer structure has a different lattice constant than the substrate.

3. The semiconductor FET device of claim 1, wherein the buffer structure has a different lattice constant than the fin structure.

4. The semiconductor FET device of claim 1, wherein the width of the buffer structure is twice or more the width of the fin structure.

5. The semiconductor FET device of claim 1, wherein an extending axis of the buffer structure is not aligned with an extending axis of the fin structure.

6. The semiconductor FET device of claim 1, wherein the width of the buffer structure is smaller than ⅓ of a thickness of the buffer structure.

7. The semiconductor FET device of claim 1, wherein the buffer structure is made of silicon germanium.

8. The semiconductor FET device of claim 7, wherein a germanium content in the silicon germanium is less than 50%.

9. The semiconductor FET device of claim 1, wherein the buffer structure is made of Group III-V compound semiconductor.

10. A semiconductor FET device, comprising:
a buffer structure having a fin shape and disposed over a substrate, the buffer structure extending along a first direction; and
a fin structure including a channel region of the FET device disposed on the buffer structure, the fin structure extending along the first direction, wherein:
a width of the buffer structure along a second direction perpendicular to the first direction is greater than a width of the fin structure along the second direction measured at an interface between the buffer structure and the fin structure, an upper surface of the buffer structure being in contact with a bottom of the fin structure at the interface, and
the buffer structure contains defects in an amount of less than $1 \times 10^3$ cm$^{-3}$.

11. A semiconductor device, comprising:
a first buffer structure having a fin shape and disposed over a substrate, the first buffer structure extending along a first direction;
a second buffer structure having a fin shape and disposed over the substrate, the second buffer structure extending along a first direction;
a first fin structure including a channel region of a first conductivity-type FET device disposed on the first buffer structure, the first fin structure extending along the first direction; and
a second fin structure including a channel region of a second conductivity-type FET device disposed on the second buffer structure, the second fin structure extending along the first direction, wherein:
a width of the first buffer structure along a second direction perpendicular to the first direction is greater than a width of the first fin structure along the second direction measured at an interface between the buffer structure and the first fin structure, an upper surface of the first buffer structure being in contact with a bottom of the first fin structure at the interface, and
a width of a bottom of the first buffer structure and a width of a bottom of the second buffer structure become smaller toward the substrate.

12. The semiconductor device of claim 11, wherein:
the first conductivity type is an n-type and the second conductivity type is a p-type, and
the first buffer structure is made of a same material as the second buffer structure.

13. The semiconductor device of claim 11, wherein:
the first conductivity type is an n-type and the second conductivity type is a p-type, and
the first buffer structure is made of a different material than the second buffer structure.

14. The semiconductor device of claim 13, wherein the first buffer structure is made of SiGe and the channel region of the first conductivity-type FET device is made of Si or SiGe.

15. The semiconductor device of claim 14, wherein a silicon content of the first fin structure is greater than a silicon content of the first buffer structure.

16. The semiconductor device of claim 13, wherein:
the second buffer structure is made of SiGe and the channel region of the second conductivity-type FET device is made of SiGe or Ge.

17. The semiconductor device of claim 16, wherein a germanium content of the second fin structure is greater than a germanium content of the second buffer structure.

18. A semiconductor FET device, comprising:
a pair of buffer structures, each having a fin shape and disposed over a substrate and extending along a first direction; and
a fin structure including a channel region of the FET device disposed on one of the pair of the buffer structures, the fin structure extending along the first direction;

wherein a bottom width of the buffer structure is smaller than a top width of the buffer structure, along a second direction perpendicular to the first direction.

19. The semiconductor FET device of claim 18, wherein a width of the buffer structure along the second direction is greater than a width of the fin structure along the second direction measured at an interface between the buffer structure and the fin structure, the upper surface of the buffer structure being in contact with a bottom of the fin structure at the interface.

20. The semiconductor FET device of claim 18, further comprising:
   a cover layer disposed on the substrate and adjacent to the pair of buffer structure; and
   an insulating layer disposed over the cover layer, wherein:
   the buffer structure is embedded in the insulating layer, and
   no cover layer is disposed between the pair of the buffer structures.

21. The semiconductor FET device of claim 18, wherein the pair of buffer structures contain defects in an amount of less than $1 \times 10^3$ cm$^{-3}$.

22. The semiconductor FET device of claim 18, wherein a width of a bottom of each of the pair of buffer structures becomes smaller toward the substrate.

\* \* \* \* \*